United States Patent [19]

Hirose

[11] Patent Number: 5,013,943
[45] Date of Patent: May 7, 1991

[54] SINGLE ENDED SENSE AMPLIFIER WITH IMPROVED DATA RECALL FOR VARIABLE BIT LINE CURRENT

[75] Inventor: Ryan T. Hirose, Colorado Springs, Colo.

[73] Assignee: Simtek Corporation, Colorado Springs, Colo.

[21] Appl. No.: 393,489

[22] Filed: Aug. 11, 1989

[51] Int. Cl.⁵ .................... H03K 17/16; H03F 3/45
[52] U.S. Cl. ........................... 307/530; 307/443; 307/451; 307/572; 307/546; 307/481; 365/203; 365/208
[58] Field of Search ............... 307/530, 443, 448, 451, 307/572–573, 546, 480–481; 365/203, 208

[56] References Cited

PUBLICATIONS

IBM Tech. Disc. Bul., "Power Supply Stabilization Circuit", Gray et al., vol. 21, No. 4, 9/78.
IBM Tech. Disc. Bul., "Read-Only Storage Bit Precharge/Sense Circuit", Cordaro, vol. 17, No. 4, 9/74.

Primary Examiner—Stanley D. Miller
Assistant Examiner—Margaret Rose Wambach
Attorney, Agent, or Firm—John R. Ley

[57] ABSTRACT

A single ended sense amplifier senses whether or not a memory cell in an array conducts current from a bit line conductor to which the sense amplifier is connected. A first stage of the sense amplifier includes a number of separately biased transistors which establish a lower voltage level at a node when the cell conducts current than the higher voltage level at the node when the cell does not conduct current. A second stage of the sensed amplifier includes transistors connected in an inverting arrangement to receive the signal from the node and supply an output signal at an output terminal in response thereto. An equalizing transistor is selectively connected between the node and the output terminal and establishes a high gain bias point voltage at the node when conductive. The high gain bias point in intermediate the higher and lower voltages established at the node by the first stage. As soon as the equalizing transistor becomes nonconductive, the second stage is immediately driven to the correct output signal level by the voltage at the node from the first stage. A precharge transistor is conneced to the bit line to raise the voltage on it to a predetermined high level, thereafter allowing the voltage to decay before sensing the logical state of the cell. Precharging the bit line avoids the uncertainties associated with charging the bit line capacitance.

14 Claims, 2 Drawing Sheets

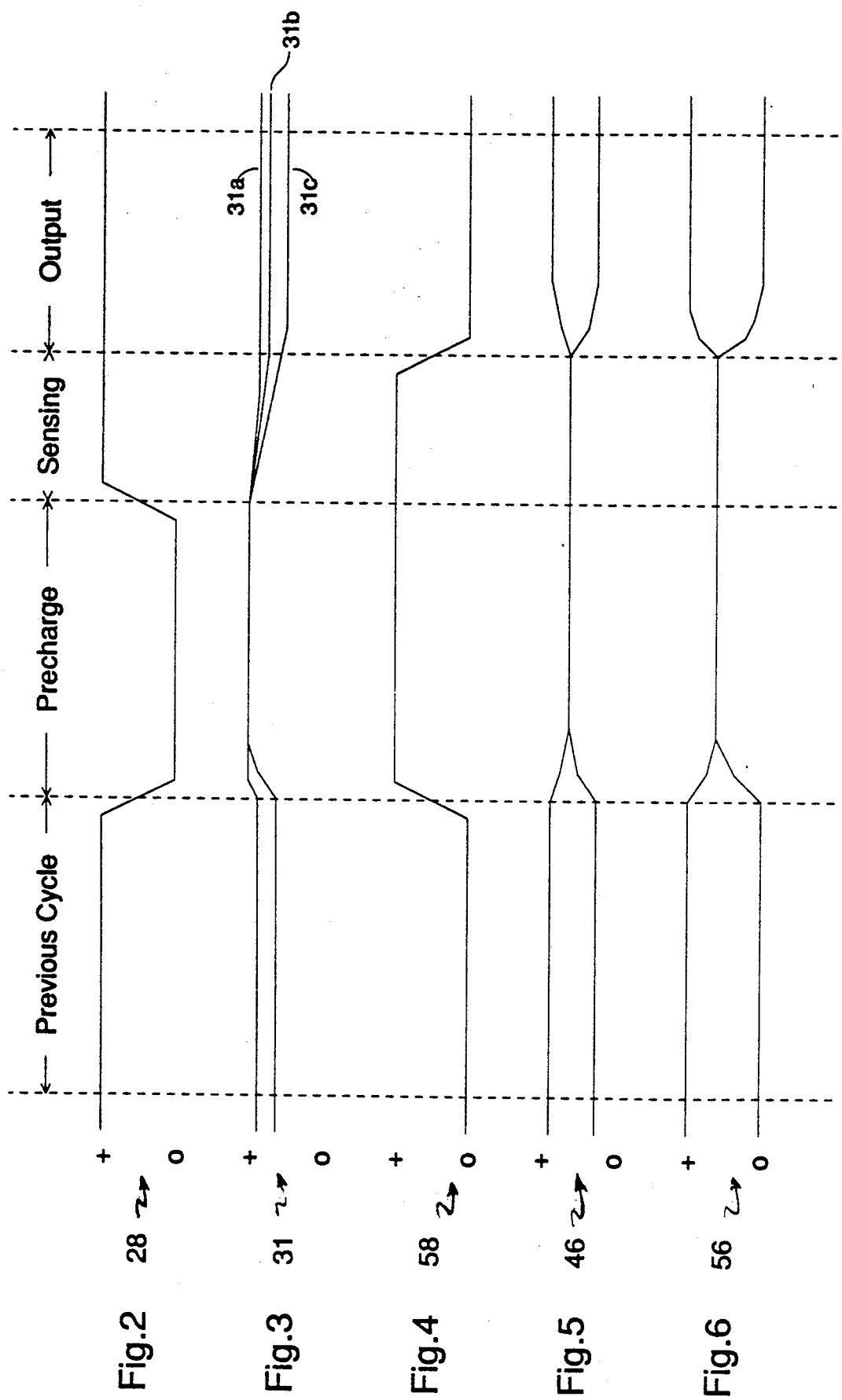

SINGLE ENDED SENSE AMPLIFIER WITH IMPROVED DATA RECALL FOR VARIABLE BIT LINE CURRENT

This invention relates to sense amplifiers, which are used to amplify a signal supplied from a memory cell in a semiconductor memory array. More particularly, the present invention relates to improvements in a single ended sense amplifier which improve the data recall capability and decrease the cell access time, while avoiding many of the detrimental influences of substantial variations in bit line current.

BACKGROUND OF THE INVENTION

The typical semiconductor memory array comprises many hundreds or thousands of individual memory cells arranged in a orthogonal pattern of columns and rows on a chip. A bit line conductor connects all of the cells in each column and conducts signals to the cells in the column for the purpose of writing data to a cell or conducts signals from the cells in the column to read data from a cell. A word line conductor connects all of the cells in a horizontal row of the array and conducts a signal to activate the cells in the row. When it is desired to access a particular cell for a data read or a data write operation, the cells in the horizontal row which include the particular cell are activated by a signal on the word line conductor, and a signal is applied to or read from a bit line conductor of the column which includes the particular cell. Thus, only the particular cell at the intersection of the word and bit lines is thereby accessed.

When a data read operation occurs, a sense amplifier is connected to each bit line in the column which includes the particular accessed cell. The accessed cell supplies a relatively low level signal indicative of the logical state of the cell, and the sense amplifier amplifies the signal to a more reliable level useable by other elements on the memory. When a data write operation occurs signals are applied to the bit line conductors in order to set the logical state of the particular accessed cell.

The memory cells are usually one of two common types. One common type of memory cell, typified by a static random access memory (SRAM) cell, provides a pair of output signals at complementary logic levels. Two bit line conductors are therefore connected to each cell in each column, and the complementary output signals are applied to the two bit line conductors. The relative difference between the two complementary bit line signals is usually relatively small, for example 0.3 volts. The relative levels of the two signals represents the logical state of the cell. A differential sense amplifier receives both complementary bit line signals at its input terminals, senses the relationship between the two complementary signals and amplifies this relatively small differential signal to a level representative of the logical state of the cell, or to a level which is easily further amplified to a level representative of the logical state of the cell.

The other common type of memory cell, typified by an electrically erasable and programmable read only memory (EEPROM) cell, provides only a single output signal on a single bit line. The logical state of the cell is represented by whether the cell conducts current when it is accessed, indicating one logical state, or whether the cell will not conduct current when it is accessed, indicating the other logical state. The sense amplifier, which is single ended in this situation because it receives only a single input current signal from the single bit line, senses whether the cell absorbs current or not when it is accessed, and supplies an output signal of an amplified level representative of the logical state of the cell.

Many EEPROM cells employ a non-volatile device to retain the logical state of the cell when the power is removed from the array. The non-volatile device of the cell controls whether or not current is conducted by the cell in the logical states. The non-volatile device used in some memory cells is a silicon nitride oxide semiconductor (SNOS) transistor. A memory nitride layer of the SNOS transistor holds a charge to provide the non-volatile characteristic of the SNOS transistor. The two logical states of the cell are represented by whether the memory nitride layer of the SNOS transistor is charged with a negative electrical change or a positive electrical charge. These two states of the SNOS transistor are commonly referred to as the programmed and erased states, and these two transistor states establish the logical states of the cell.

The current conductivity characteristics of a SNOS transistor are considerably different in the programmed and erased states. For example, the amount of current conducted at the beginning of life of the SNOS transistor may be about 100 microamperes in one state and almost nothing in the other state. Over time, however, the ability of the memory nitride layer to retain the charge diminishes, due to natural life time deterioration. The amount of current which the SNOS transistor is capable of conducting in one state at the beginning of its life, may be up to ten times greater than that current it is capable of conducting in the same state at the end of its life. At the end of the expected life of the SNOS transistor, the memory nitride layer is incapable of holding a sufficient charge to modify the conduction characteristics of the transistor sufficiently enough to enable the sense amplifier to reliably distinguish the two logical states of the cell.

If the sense amplifier cannot reliably sense a difference in current between the two logical states of the cell (no current being conducted, and a small current being conducted), data from the cell can no longer be reliably recalled and the cell has reached the end of its useful lifetime. The utility of a non-volatile memory which employs SNOS or similar devices whose output current degrade with time, is influenced by its ability to reliably recall the correct data state under end of life conditions. Similarly, any type of memory cell that is subject to variable output currents is subject to many of the same problems and concerns as are applicable memory cells employing SNOS transistors. It is therefore desireable to extend the ability of the memory array to successfully recall data for as long as possible in the case of degrading devices such as SNOS transistors and under circumstances where there are potentially significant variations in the output or bit line current from the cell for reasons other than those associated with SNOS transistors.

The length of the bit lines in a memory array may be significant, since the bit lines connect hundreds or thousands of cells in each column. The bit line capacitance increases with its length. Large bit line capacitance makes sensing the bit line current more difficult, because the bit line draws current to charge its capacitance and modifies the amount of current sensed by the sense amplifier. The bit line capacitance makes it more difficult to reliably sense whether the cell is conducting current or not.

The settling time or time delay required to allow the bit line capacitance to charge or discharge before an accurate signal level representative of the logical state of the cell is available, increases the access time associated with the memory. The access time is that total amount of time required after the memory address signals are applied, for accessing a particular cell before the signal representative of the logical state of the cell is reliably presented. With most modern computer systems, increased access times are undesirable because they delay the data processing functions.

It is against this abbreviated summary of considerations that the present invention of improvements in single ended sense amplifiers has evolved.

SUMMARY OF THE INVENTION

The single ended sense amplifier of the present invention offers the capability of successfully recalling the logical state of a single bit line memory cell, by substantially avoiding the adverse charging effects of bit line capacitance, and without substantial regard for the relatively significant variations in bit line current conducted by a memory cell.

In accordance with one of its major aspects, the sense amplifier utilizes first and second stage amplifying means. The first stage amplifying means, which is preferably formed by a series of cascode connected transistors, is connected to the bit line conductor which connects the sense amplifier to a memory cell. A first bias signal at a predetermined level is established at a node when the memory cell conducts current from the bit line conductor, and a second bias signal at a different predetermined level is established at the node when the memory cell does not conduct current from the bit line conductor. The second stage amplifying means, which is preferably formed by a pair of inverting connected transistors, is connected to the node and supplies an output signal at an output terminal of the sense amplifier. The output signal is related to the logical state of the cell as represented by the predetermined levels of the first and second bias signals. The second stage amplifying means has a high gain bias point at which a relatively small change in the signal at the node causes a substantially larger change in the output signal. An equalization means, preferably a transistor, is connected between the node and the output terminal to selectively connect the node and the output terminal and to establish the high gain bias point. The high gain bias point is between the predetermined levels of the first and second bias signals, and immediately after the equalization means operatively disconnects the node and the output terminal after the high gain point has been established, the predetermined level of the first or second bias signal drives the second stage amplifying means to provide the related output signal without spurious transitions.

According to another one of its major aspects, the sense amplifier includes a precharge means connected to the bit line conductor and operative for raising the voltage on the bit line conductor to a predetermined level, and thereafter releasing the bit line conductor to allow it to decay. The voltage is sensed on the bit line conductor at a predetermined time when the precharge means releases the bit line conductor. By sensing the voltage on the bit line conductor after it has been precharged and has started to decay, the effects of charging the bit line capacitance and the variability in the current conducted by the cell are lessened. The first and second stage amplifying means are sensitive enough to detect the logical state of the cell from the decay in the bit line voltage, even over the lifetime of a variable current transistor such as a SNOS transistor. At the beginning of life a SNOS transistor draws more current which makes the bit line conductor decay more quickly and further enhances the ability of the sense amplifier to detect the correct logical state of the cell.

A more complete understanding and appreciation of the present invention can be obtained by reference to the accompanying drawings, which are briefly described below, from the following detailed description of a presently preferred embodiment, and from the appended claims.

BRIEF SUMMARY OF THE DRAWINGS

FIGS. 2, 3, 4, 5 and 6 are waveform diagrams shown on a common time axis, illustrating signals at various points within the sense amplifier shown in FIG. 1, during a sensing cycle of the memory cell, and signals in various levels during a previous sensing cycle.

DETAILED DESCRIPTION

Figure 1:
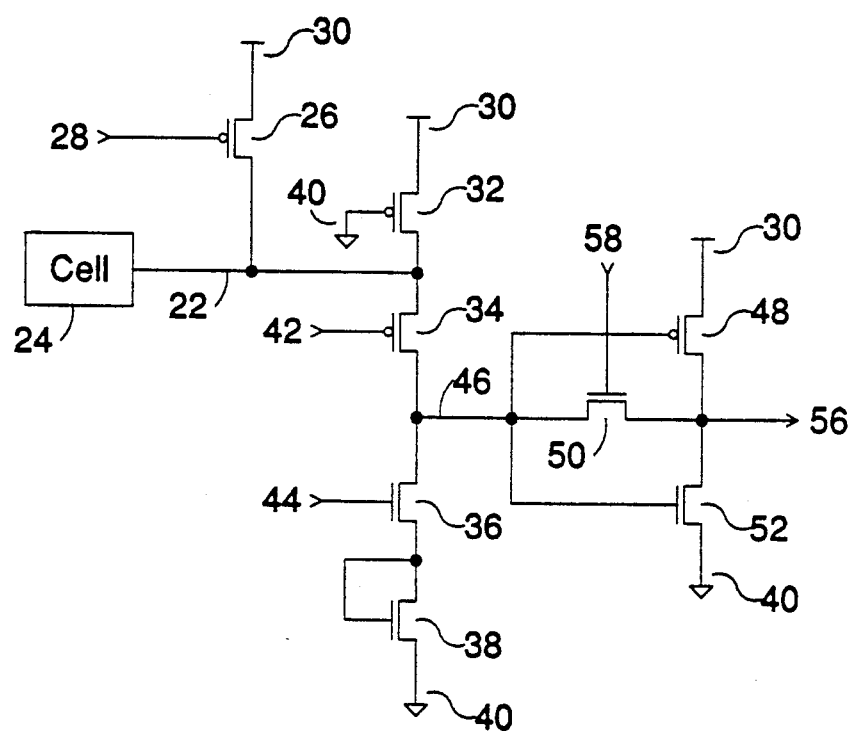
FIG. 1 is a schematic diagram of the presently preferred embodiment of the single ended sense amplifier of the present invention, connected to a bit line conductor and a single memory cell shown as a block diagram.

A presently preferred form of the single ended sense amplifier 20 which embodies the present invention is shown in FIG. 1. The sense amplifier 20 is connected by a bit line conductor 22 to a memory cell 24. The memory cell 24 is of the type providing only a single output signal on the bit line conductor 22. The logical state (a "1" or a "0") of the memory cell 24 is represented by its ability to conduct current from the bit line conductor 22, or an inability to conduct current from the bit line conductor 22. The two logical states may in actuality be represented by a substantially greater ability to conduct current and a substantially reduced capability to conduct current, and are referred to below as a conductive logical state and a nonconductive logical state, respectively. The sense amplifier is shown implemented in FIG. 1 in complementary, enhancement mode, field effect transistors, but other implementation techniques may be employed, as is appreciated.

The cell 24 may include, but is not necessarily required to include, a non-volatile device which establishes an electrical characteristic representative of the logical state of the cell. One typical non-volatile device is a conventional SNOS transistor. In one state, negative charge is stored or programmed in the memory nitride layer of the SNOS transistor, and in the other state, positive charge is stored (erasure of negative charge) in the memory nitride layer. In one state the SNOS transistor will conduct current from the bit line conductor 22 and in the other state the SNOS transistor will not conduct current from the bit line conductor, thereby establishing the current conductive and nonconductive logical states of the cell.

The amount of current conducted by the SNOS transistor of the cell 24 varies in accordance with the amount of charge stored in the memory nitride layer. The memory nitride layer stores a greater amount of charge at the beginning of life of the SNOS transistor than at the end of its life, due to the leakage of charge out of the memory nitride layer over time. Therefore at the beginning of life, a greater amount of current will be conducted by the cell in its conductive logical state than at the end of life. The small amount of current drawn by the cell in the nonconductive logical state is approximately the same both at the beginning and at the end of life.

The difficulties in accurately sensing variable bit line current are substantially reduced by the use of a bit line precharge means such as a precharge transistor 26. The bit line conductor 22 is charged to a predetermined high voltage level at the beginning of each individual cell sensing cycle by the precharge transistor 26. The conductivity of the precharge transistor 26 is controlled by a precharge control signal (FIG. 2) applied at 28 to the gate terminal of the transistor 26, by conventional means not shown. The precharge control signal 28 (FIG. 2) is a pulse which goes low at the beginning of the sensing cycle, causing transistor 26 to charge the bit line conductor 22 to approximately the voltage level of a positive power source 30 (Vcc). After a predetermined time during which the voltage or signal 31 (FIG. 3) on the bit line conductor 22 reaches the level of the source 30, the precharge control signal 28 returns to high level, thereby terminating the conduction of transistor 26. The bit line conductor 22 is then free to decay to a level indicative of the logical state of the cell.

Regardless of whether the bit line conductor had previously been at a high level or at a low level (represented by the two levels shown in the previous cycle portion of FIG. 3), the bit line conductor 22 reaches the level of the positive power supply prior to the termination of the precharge control pulse. Thereafter the voltage on the bit line conductor starts to decay. If the cell is in the nonconductive logical state, the amount of decay is relatively small as shown by the segment 31a. If the cell is in the conductive logical state, the amount of decay is relatively greater as shown by the two segments 31b and 31c. The segment 31b illustrates the end of life condition where the SNOS transistor draws less current, and the amount of voltage decay on the bit line conductor is less. The segment 31c illustrates the beginning of life condition where more current is drawn by the SNOS transistor, and the amount of voltage decay on the bit line conductor is greater.

In either the beginning of life or the end of life conditions of an SNOS transistor, or under other conditions of significant variability in the bit line current, the bit line conductor decay characteristics are predictable enough after the bit line conductor has been precharged, to reliably distinguish between the conductive and nonconductive logical states of the cell. Precharging the bit line conductor also has the effect of substantially reducing the variable current effects of the bit line capacitance, thereby increasing the reliability in sensing of the logical state of the cell.

A first amplification stage of the sense amplifier 20 is achieved by transistors 32, 34, 36 and 38. The transistors 32, 34, 36 and 38 have their sources and drains connected in series in a cascode configuration between the positive power source 30 (Vcc) and a reference or negative power source 40 (Vss). The bit line conductor 22 is connected to the junction of the source and drain of transistors 32 and 34 respectively. The gate of transistor 32 is connected to the negative power source 40 to limit the voltage on the bit line conductor 22. The size of transistor 32 as implemented in silicon sets the amount of current it supplies.

When the cell 24 is in the nonconductive logical state, the transistor 32 supplies a predetermined amount of current to the transistors 34, 36 and 38, and very little or no current to the bit line conductor 22. The predetermined amount of current conducted by the transistor 32 is approximately the same amount of current which the cell 24 will conduct in the conductive logical state when a SNOS transistor of the cell nears end of life. Establishing the current from transistor 32 at this level causes even the current conducted by the cell 24 in the conductive logical state to be significant relative to the current supplied by transistor 32, thereby making detection of the conductive logical state more reliably accomplished.

Transistor 38 has its gate terminal connected to its drain, to limit the current through transistor 36 and to allow transistor 36 to be of reasonable size. The predetermined amount of constant current conducted by the transistor 38 is established by its size as implemented in silicon, and that predetermined constant current is approximately one-half the amount of current conducted by the transistor 32 when the cell is in the nonconductive logical state.

Transistors 34 and 36 receive separate and different reference bias signals at their gate terminals 42 and 44, respectively. The reference signals at terminals 42 and 44 are supplied by conventional voltage sources (not shown), and the magnitudes of these signals are selected to bias the transistors 34 and 36 to achieve the functionality described below.

The magnitude of the reference signal at 42 is selected to be at least one threshold voltage below the normal operating voltage present at the bit line conductor 22. The normal voltage on the bit line conductor is established by the transistor 32 when the precharge transistor 26 and the cell 24 are nonconductive. Arranging the reference signal at 42 at least one threshold below the normal bit line level causes transistor 34 to be normally conductive when the cell 24 is in the nonconductive logical state and causes transistor 34 to become substantially nonconductive when the cell 24 is in the conductive logical state. In the conductive logical state, the voltage on the bit line conductor 22 drops due to the diversion of current from the transistor 32 through the bit line conductor 22 to the current conducting cell. The source to gate voltage of transistor 34 drops below the one threshold level, and the transistor 34 becomes substantially less conductive or nonconductive. When the cell 24 is in the nonconductive logical state, the voltage on the bit line conductor 22 does not drop substantially because no current is diverted from the transistor 32 to the cell 24. The gate to source voltage on transistor 34 remains at or above the one threshold level, and the transistor 34 maintains its conductivity. Thus, the transistor 34 changes from a conductive state to a nonconductive state when the current is drawn through the bit line conductor 22.

The reference bias voltage at terminal 44 is selected to bias transistor 36 to maintain a constant current over a wide range of voltages at node 46. One of two predetermined levels of voltage will be established at node 46 by the first stage transistors. A higher one of the two predetermined voltage levels at node 46 is maintained by the transistor 36 when the bit line conductor 22 does not conduct current to the cell 24 and the transistor 34 is conductive as explained above. A lower one of the two predetermined levels at node 46 is maintained by the transistor 36 when the bit line conductor 22 does conduct current to the cell and the transistor 34 is nonconductive as explained above. The significance of the two levels of predetermined voltage at node 46 is understood in relation to the second amplifying stage of the sense amplifier 20, which includes transistors 48, 50 and 52.

Transistors 48 and 52 have their gate terminals commonly connected at the node 46. The output terminal of the sense amplifier 20, node 56, is located at the common junction of the sources of transistors 48 and 52. The output node 56 is selectively connected to the input terminals of transistors 48 and 52, node 46, through an equalizing means, preferably the transistor 50. An equalization control signal or pulse (FIG. 4) is applied at 58 to the gate terminal of transistor 50 to control the conductivity of the transistor 50. When the transistor 50 is conductive during the time that the equalization control pulse 58 is high as shown in FIG. 4, the nodes 46 and 56 are essentially connected or shorted together. When the transistor 50 is nonconductive after the equalization control pulse 58 returns to a low level (FIG. 4), the nodes 46 and 56 are disconnected and free to reach their own different levels. With the exception of transistor 50, the transistors 48 and 52 are connected in a typical inverting configuration.

As is recognized for the inverting amplifier created by transistors 48 and 52, the shorted connection of the input and output terminals causes the transistors 48 and 52 to assume a high gain point. The high gain point is that point on the transfer characteristic of the inverting connected transistors where the output signal is in an intermediate state between a high signal and a low signal, but where a very small change in the input signal will cause an immediate change of the output signal to a high or a low state. By selectively shorting the output terminal 56 to the input terminal 46 with the equalization transistor 50, the high gain point of transistors 48 and 52 is established, and a high gain point bias level at node 46 is established. The high gain bias level at node 46 is between the two predetermined bias levels created at node 46 by the first stage transistors 32, 34, 36 and 38 when the cell is in the conductive and nonconductive logical states, as is shown in FIG. 5.

When the equalization transistor 50 is conductive, the high gain bias level voltage established by the equalization transistor 50 at node 46 predominates over the bias voltage which would otherwise be established at the node 46 by the first stage transistors. Upon the equalization control signal pulse 58 returning to a low level (FIG. 4) and the equalization transistor 50 ceases conducting, and the voltage at node 46 assumes one of the two bias levels established by the first stage transistors (FIG. 5). If the cell 24 is in the nonconductive logical state, the voltage at node 46 assumes a somewhat higher level than the high gain point bias voltage established when the equalization transistor 50 is conductive. The elevated voltage level at node 46 under these conditions decreases the conductivity of transistor 48 and increases the conductivity of transistor 52, thereby driving low the output signal at node 56, as is shown in FIG. 6. If the cell 24 is drawing current in the conductive logical state, the voltage level established at node 46 is somewhat below the high gain point bias voltage established when the equalization transistor 50 is conductive. The lower voltage level at node 46 under these conditions increases the conductivity of transistor 48 and decreases the conductivity of transistor 52, thereby driving high the output signal at node 56, as is also shown in FIG. 6.

The sensitivity of the transistors 48 and 52 allows relatively small changes in voltage at node 46 to cause relatively large and rapid changes in the level of the output signal at node 56. Adjusting the reference bias voltages of transistors 34 and 36 so they provide levels at node 46 which are somewhat above and somewhat below the high gain bias point, in the nonconductive and the conductive logical states of the cell 24 respectively, assures that the output signal at node 56 changes states very rapidly. Accordingly, the output signal at node 56 very quickly achieves an amplified level which is representative of the logical state of the cell 24, thereby improving the access time for reading data from the cell 24.

By precharging the bit line conductor, and sensing its condition a predetermined time after the bit line conductor starts decaying (represented by the time delay between the termination of the precharge signal pulse 28 shown in FIG. 2 and the termination of the equalization control pulse 58 shown in FIG. 4), the delay and uncertainty caused by charging the bit line capacitance is avoided. The variable affects of reduced current from a SNOS transistor of the cell 24 or from other causes is also avoided, by sensing the bit line current after it has started to decay after having first been precharged, and by essentially matching the normal current through the transistors 32, 34, 36 and 38 to the end of life current conducted by the SNOS transistor. Since the beginning of life current is much greater, the voltage level on the bit line conductor 22 drops earlier in the sensing cycle than at the end of life. However, in both the beginning of life or the end of life cases, or in other situations where there is significant variability in the bit line current, the voltage drops a sufficient level on the bit line conductor 22 so the logical state of the cell 24 can be reliably sensed. Lastly, by precharging the bit line conductor, equalizing the input and output signals of transistors 48 and 52 to the high gain bias point, and thereafter releasing the equalization so that the first stage transistors establish the input signal to the second stage transistors, the problem of transient or indeterminate output signals appearing at node 56 prior to achieving the correct output level corresponding to the logical state of the cell 24 is avoided. A decrease in access time is also achieved because a time delay is not required to allow the transient condition to dissipate before the correct signal is presented from the sense amplifier 20.

A presently preferred embodiment of the single ended sense amplifier of the present invention, and a number of its improvements, have been described with a degree of particularity. It should be understood, however, that this description has been made by way of preferred example, and that the invention itself is defined by the scope of the appended claims.

The invention claimed is:

1. A single ended sense amplifier connected to a bit line conductor of a memory array of the type having a plurality of memory cells which each represent a first logical state by conducting current from the bit line conductor and a second logical state by not conducting current from the bit line conductor, comprising:

first stage amplifying means connected to the bit line conductor and operative for establishing a first bias signal at a predetermined level at a node when the memory cell conducts current in one logical state and for establishing a second bias signal at a different predetermined level at the node when the memory cell does not conduct current from the bit line conductor in the other logical state; and second stage amplifying means connected to the node and operative in response to the first and second bias signals to supply an output signal at an output terminal of the sense amplifier which has two predetermined levels which relate in a predetermined manner to the predetermined levels of the first and second bias signals at the node, said second stage amplifying means having a high gain bias point at which a relatively small change in the signal at the node causes the output signal to change between the two predetermined levels, the high gain bias point being intermediate the predetermined levels of the first and second bias signals at the node, and said second stage amplifying means comprising an equalizing means for selectively connecting the node and the output terminal to establish the high gain bias point at the node and to override the first or second bias signal at the node and for thereafter selectively disconnecting the node and the output terminal to allow the predetermined level of the first or second bias signal to drive the second amplifying means to supply the output signal related to the first or second bias signal.

2. A sense amplifier as defined in claim 1 wherein the first amplifying means comprises:

current supplying means connected to the bit line conductor for supplying a predetermined supply current; and means connected to the bit line conductor and the node and receptive of the predetermined supply current and operative in response to a voltage on the bit line conductor established by the cell conducting current from the current supplying means in the first logical state for creating the first bias signal at the node and also operative in response to the voltage on the bit line conductor established by the cell not conducting current from the current supplying means in the second logical state for creating the second bias signal at the node, the first bias signal having a predetermined level which is less than the predetermined level of the second bias signal.

3. A sense amplifier as defined in claim 2 wherein said means for creating the first and second bias signals further comprises:

a first transistor connected between the bit line conductor and the node and biased to conduct current from the current supplying means and to establish the second bias signal on the node when the voltage on the bit line conductor remains high due to the cell not conducting current in the second logical state and biased to not conduct current from the current supplying means when the voltage on the bit line conductor decreases due to the cell conducting current in the first logical state; and a second transistor connected to the node and biased to conduct current from the node and to establish the first bias signal at the node when the first transistor is not conducting.

4. A sense amplifier as defined in claim 3 further comprising:

a constant current supplying means connected between the second transistor and a reference potential.

5. A sense amplifier as defined in claim 2 wherein the second amplifying means comprises:

a pair of transistors having common terminals connected together at the output terminal and their input terminals commonly connected at the node; and wherein:

said equalizing means comprises an equalizing transistor connected between the output terminal and the node and selectively controlled to establish essentially the same high gain bias point signal on the node and the output terminal when conductive.

6. A single ended sense amplifier connected to a bit line conductor of a memory array of the type having a plurality of memory cells which each represent a first logical state by conducting current from the bit line conductor and a second logical state by not conducting current from the bit line conductor, comprising:

first stage amplifying means connected to the bit line conductor and operative for establishing a first bias signal at a predetermined level at a node when the memory cell conducts current in one logical state and for establishing a second bias signal at a different predetermined level at the mode when the memory cell does not conduct current from the bit line conductor in the other logical state;

second stage amplifying means connected to the node and operative in response to the first and second bias signals to supply an output signal at an output terminal of the sense amplifier which has two predetermined levels which relate in a predetermined manner to the predetermined levels of the first and second bias signals at the node, said second stage amplifying means having a high gain bias point at which a relatively small change in the signal at the node causes the output signal to change between the two predetermined levels, the high gain bias point being intermediate the predetermined levels of the first and second bias signals at the node, and said second stage amplifying means comprising an equalizing means for selectively connecting the node and the output terminal to establish the high gain bias point at the node and to override the first or second bias signal at the node and for thereafter selectively disconnecting the node and the output terminal to allow the predetermined level of the first or second bias signal to drive the second amplifying means to supply the output signal related to the first or second bias signal; and precharge means connected to the bit line conductor and operative for raising the voltage on the bit line conductor to a predetermined level before said equalizing means disconnects the node and the output terminal to establish the output signal.

7. A sense amplifier as defined in claim 6 wherein:

the precharge means applies a voltage of a predetermined level to the bit line conductor for a predetermined time and thereafter ceases applying the voltage to the bit line conductor to allow the bit line conductor to start to decay to a level representative of the logical state of the cell; and the equalizing means the precharge means become operative at approximately the same time and the equalizing means disconnects the node and the output terminal a predetermined delay time after the precharge means has ceased applying the predetermined voltage to the bit line conductor.

8. A sense amplifier as defined in claim 7 wherein:

the predetermined delay time is sufficient to allow the voltage on the bit line conductor to decay to a level representative of the logical state of the cell.

9. A sense amplifier as defined in claim 8 wherein the memory cell includes a SNOS device which draws current from the bit line conductor to establish one logical state of the cell, and the amount of current drawn by the SNOS device diminishes over time, and wherein:

the predetermined time delay is sufficient to allow the voltage on the bit line conductor to decay to a level which the first amplifying means responds by creating sufficiently different first and second bias signals to allow the second amplifying means to create the output signal even when the SNOS device nears its end of life.

10. A single ended sense amplifier connected to a bit line conductor of a memory array of the type having a plurality of memory cells which each represent a first logical state by conducting current from the bit line conductor and a second logical state by not conducting current from the bit line conductor, comprising:

precharge means connected to the bit line conductor and operative for raising the voltage on the bit line conductor to a predetermined level and thereafter releasing the bit line conductor to decay to a voltage level determined by whether the cell is conducting current or not and representative of the logical state of the cell; and amplifying means connected to the bit line conductor and including means operative after the precharge means has released the bit line conductor for developing a bias signal at a node which represents the extent to which the voltage on the bit line conductor has decayed, an output terminal upon which to supply an output signal, and equalizing means for selectively connecting and disconnecting the node and the output terminal, the amplifying means having a high gain point at which a relatively small change in the signal at the node causes the output signal to change to a relatively greater extent, the high gain point existing when the node and the output terminal are connected together, the connection of the node and the output terminal by the equalizing means establishing the high gain point at node and overriding the bias signal at the node, the disconnection of the node and output terminal at a predetermined delay time after the precharge means has released the bit line conductor allowing the bias signal at the node to cause the amplifying means to supply an output signal representative of the logical state of the cell as determined by the extent to which the voltage on the bit line conductor has decayed.

11. A sense amplifier as defined in claim 10 wherein: the predetermined delay time is sufficient to allow the voltage on the bit line conductor to decay to a level representative of the logical state of the cell.

12. A single ended sense amplifier connected to a bit line conductor of a memory array of the type having a plurality of memory cells which each represent a first logical state by conducting current from the bit line conductor and a second logical state by not conducting current from the bit line conductor, each memory cell including a SNOS device which draws current from the bit line conductor to establish at least one logical state of the cell, the amount of current drawn by the SNOS device diminishing over time, said sense amplifier comprising:

precharge means connected to the bit line conductor and operative for raising the voltage on the bit line conductor to a predetermined level and thereafter releasing the bit line conductor to assume a voltage level determined by whether the cell is conducting current or not and representative of the logical state of the cell; and amplifying means connected to the bit line conductor and operative a predetermined delay time after the precharge means has released the bit line conductor for sensing the extent to which the voltage on the bit line conductor has decayed and to supply an output signal representative of the logical state of the cell as determined by the extent to which the voltage on the bit line conductor has decayed, the predetermined delay time being sufficient to allow the voltage on the bit line conductor to decay to a level representative of the logical state of the cell and sufficient to allow the voltage on the bit line conductor to decay to levels which are sufficiently different in the two logical states even when the SNOS device nears its end of life.

13. A sense amplifier as defined in claim 12 wherein said amplifying means comprises:

first stage amplifying means connected to the bit line conductor and operative for establishing a first bias signal at a predetermined level at a node when the memory cell conducts current in one logical state and for establishing a second bias signal at a different predetermined level at the node when the memory cell does not conduct current from the bit line conductor in the other logical state; and second stage amplifying means connected to the node and operative in response to the first and second bias signals to supply the output signal at an output terminal of the sense amplifier which has two predetermined levels which relate in a predetermined manner to the predetermined levels of the first and second signals at the node.

14. A sense amplifier as defined in claim 13 wherein:

said second stage amplifying means has a high gain bias point at which a relatively small change in the signal at the node causes the output signal to change between the two predetermined levels, the high gain bias point being intermediate the predetermined levels of the first and second bias signals at the node; and said second stage amplifying means comprising an equalizing means for selectively connecting the node and the output terminal to establish the high gain bias point at the node and to override the first or second bias signal at the node and for thereafter selectively disconnecting the node and the output terminal to allow the predetermined level of the first or second bias signal established by the first amplifying means at the node to drive the second amplifying means to supply the output signal related to the first or second bias signal present at the node.

* * * * *